(12) United States Patent
Shaikh

(10) Patent No.: US 10,096,475 B1
(45) Date of Patent: Oct. 9, 2018

(54) SYSTEM AND METHOD FOR DEPOSITING A HOMOGENOUS INTERFACE FOR PECVD METAL-DOPED CARBON HARDMASKS

(71) Applicant: LAM RESEARCH CORPORATION, Fremont, CA (US)

(72) Inventor: Fayaz Shaikh, Lake Oswego, OR (US)

(73) Assignee: LAM RESEARCH CORPORATION, Fremont, CA (US)

(*) Notice: Subject to any disclaimer, the term of this patent is extended or adjusted under 35 U.S.C. 154(b) by 0 days.

(21) Appl. No.: 15/816,268

(22) Filed: Nov. 17, 2017

(51) Int. Cl.
*H01L 21/033* (2006.01)
*H01L 21/02* (2006.01)

(52) U.S. Cl.
CPC ...... *H01L 21/0332* (2013.01); *H01L 21/0214* (2013.01); *H01L 21/02115* (2013.01); *H01L 21/02205* (2013.01); *H01L 21/02247* (2013.01); *H01L 21/02274* (2013.01); *H01L 21/0337* (2013.01)

(58) Field of Classification Search
CPC ............ H01L 21/0337; H01L 21/0332; H01L 21/02115; H01L 21/0214; H01L 21/02126; H01L 21/02205; H01L 21/02247; H01L 21/02274
See application file for complete search history.

(56) References Cited

U.S. PATENT DOCUMENTS

2016/0027614 A1* 1/2016 Manna ................. C23C 16/042
 216/49
2016/0314960 A1* 10/2016 Cheng ................. H01L 21/0234

* cited by examiner

*Primary Examiner* — Andrew Q Tran

(57) ABSTRACT

A method for depositing a hardmask layer on a substrate includes nitridating a first layer of the substrate. The first layer is selected from a group consisting of silicon dioxide and silicon nitride. An amorphous carbon layer is deposited on the nitridated first layer via plasma-enhanced chemical vapor deposition (PECVD). A monolayer is deposited on the amorphous carbon layer using gas mixture including a metal precursor gas with a reducing agent and without plasma. A bulk metal-doped carbon hardmask layer is deposited on the monolayer.

17 Claims, 6 Drawing Sheets

SYSTEM AND METHOD FOR DEPOSITING A HOMOGENOUS INTERFACE FOR PECVD METAL-DOPED CARBON HARDMASKS

FIELD

The present disclosure relates to substrate processing systems and methods, and more particularly to systems and methods for depositing metal-doped carbon hardmasks on substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During processing of substrates such as semiconductor wafers, various substrate treatments including deposition, patterning, and/or etching are performed. Substrate processing systems for performing deposition typically include a processing chamber with a pedestal. A substrate such as a semiconductor wafer may be arranged on the pedestal. A process gas mixture including one or more precursor gases may be introduced into the processing chamber to deposit film on the substrate. Plasma may be used to activate chemical reactions.

Etching may be performed in a processing chamber by introducing etch gas mixtures into the processing chamber. Plasma may also be used during etching. During etching, it may be desirable to etch some areas of the substrate while not etching other areas of the substrate. Hardmask film may be deposited and patterned on the substrate prior to etching to prevent etching in certain areas of the substrate under the hardmask film. The hardmask film needs to be hard and dense to withstand the etch process. After etching is performed, the hardmask film needs to be removed by a hardmask removal process that does not damage the substrate.

Amorphous carbon and polysilicon based films may be used as hardmasks for etching high aspect ratio (HAR) features. In VNAND and dynamic random access memory (DRAM) applications, the hardmask film needs to be highly etch selective to dielectric layers underlying the hardmask film. Therefore, the hardmask film should be hard and dense (while balancing ease of removal and etch selectivity) and provide control over modulation of hole etch uniformity.

Metal-doped carbon hardmasks can also be used in advanced memory patterning applications. Metal-doped carbon hardmasks can be used when underlying dielectric layers include silicon dioxide ($SiO_2$) and/or silicon nitride ($Si_3N_4$ or SiN). Metal-doped carbon hardmasks may be deposited in a plasma-enhanced chemical vapor deposition (PECVD) chamber using a precursor gas mixture including metal-containing halides (such as fluorides (F) and chlorides (Cl)) and hydrocarbon ($C_xH_y$) precursor gas, where x and y are integers greater than zero. Hardmask film that is deposited using precursor gas including F or Cl species does not bond well to $SiO_2$ or SiN film. Hydroxide (—OH) groups in underlying dielectric layers also do not bond to the metal containing compounds. In addition, F and Cl-based radicals produce volatile compounds that are pumped away during the process.

Several adhesion/interface layers are also being evaluated such as boron carbide ($B_4C$), carbon (C), boron (B), or tungsten silicide ($WSi_2$). These materials provide good adhesion at an interface between the metal-doped carbon hardmask and $SiO_2$ or SiN. However, these materials are different than the substrate ($SiO_2$ or SiN) and the hardmask (metal-doped carbon), which may cause issues when removing the masks after pillar etching is complete or require extra steps to strip an interface layer.

SUMMARY

A method for depositing a hardmask layer on a substrate includes nitridating a first layer of the substrate. The first layer is selected from a group consisting of silicon dioxide and silicon nitride. An amorphous carbon layer is deposited on the nitridated first layer via plasma-enhanced chemical vapor deposition (PECVD. A monolayer is deposited on the amorphous carbon layer using gas mixture including a metal precursor gas with a reducing agent and without plasma. A bulk metal-doped carbon hardmask layer is deposited on the monolayer.

In other features, a thickness of the amorphous carbon layer is in a range from 2 nm to 10 nm. The reducing agent comprises a halide-based reducing agent. The first layer includes silicon dioxide and the nitridating of the first layer creates a silicon oxynitride interface. The first layer includes silicon nitride layer. The silicon nitride layer includes a native silicon dioxide layer. The nitridating of the first layer creates a silicon oxynitride interface.

In other features, depositing the amorphous carbon layer includes supplying a gas mixture including a hydrocarbon precursor gas and an inert gas. The metal precursor gas includes a metal selected from a group consisting of tungsten (W), titanium (Ti), molybdenum (Mo), and aluminum (Al).

In other features, the bulk metal-doped carbon hardmask layer includes the metal.

In other features, the method is performed in a PECVD chamber.

In other features, nitridating comprises heating the substrate to a predetermined temperature in a temperature range from 350° C. to 550° C.; and supplying an inert gas mixture include molecular nitrogen.

A method for depositing a hardmask layer on a substrate includes nitridating a first layer of the substrate. The first layer is selected from a group consisting of silicon dioxide and silicon nitride. The nitridating includes heating the substrate to a predetermined temperature in a temperature range from 350° C. to 550° C. and supplying an inert gas mixture include molecular nitrogen. The method includes depositing an amorphous carbon layer on the nitridated first layer via plasma-enhanced chemical vapor deposition (PECVD). The method includes depositing a monolayer on the amorphous carbon layer having a thickness in a range from 2 nm to 10 nm using gas mixture including a metal precursor gas with a halide-based reducing agent and without plasma. The method includes depositing a bulk metal-doped carbon hardmask layer on the monolayer.

In other features, the first layer includes silicon dioxide and the nitridating of the first layer creates a silicon oxynitride interface. The first layer includes silicon nitride layer, wherein the silicon nitride layer includes a native silicon dioxide layer, and wherein the nitridating of the first layer creates a silicon oxynitride interface.

In other features, the methods include depositing the amorphous carbon layer includes supplying a gas mixture including a hydrocarbon precursor gas and an inert gas. The metal precursor gas includes a metal selected from a group consisting of tungsten (W), titanium (Ti), molybdenum (Mo), and aluminum (Al). The bulk metal-doped carbon hardmask layer includes the metal.

In other features, the method is performed in a PECVD chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
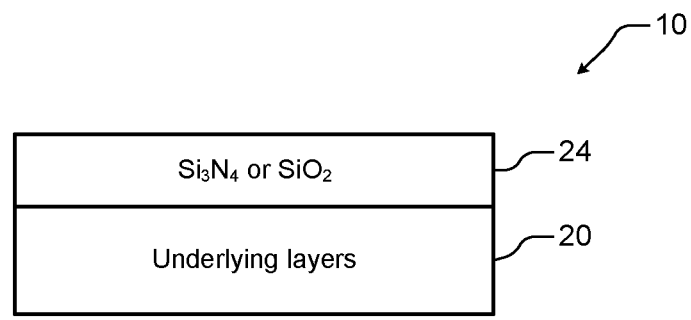
FIG. 1 is a side cross-sectional view of a substrate including a silicon dioxide or silicon nitride layer.

Systems and methods according to the present disclosure are used to create a homogenous interface between SiN and $SiO_2$ layers and a bulk metal-doped carbon hardmask layer. The homogenous interface according to the present disclosure has an elementally homogeneous composition with respect to the bulk metal-doped carbon hardmask. The homogenous interface can be used in integrated process flows designed for DRAM, VNAND, and/or back end of line (BEOL) applications.

The homogenous interface includes the same elements as the bulk metal-doped carbon hardmask. For example, the homogenous interface includes carbon (C), hydrogen (H) and metal such as tungsten (W), titanium (Ti), molybdenum (Mo) or aluminum (Al). In some examples, the homogenous interface is created in the same processing chamber as the bulk metal-doped carbon hardmask. In some examples, the bulk metal-doped carbon hardmask includes tungsten carbide (WC), titanium carbide (TiC), or other bulk metal-doped carbon hardmask materials. Examples of processes for deposition of bulk metal-doped carbon hardmask film can be found in "Metal Doping of Amorphous Carbon and Silicon Films Used as Hardmasks in Substrate Processing Systems", commonly assigned U.S. Pat. No. 9,520,295, which is incorporated herein by reference in its entirety.

The homogenous interface may be used for substrates including exposed $SiO_2$ or SiN film. A silicon oxynitride ($SiO_rN_s$ where r and s are integers) interface is created by nitridating the $SiO_2$ or SiN layer. To nitridate the $SiO_2$ or SiN layer, the substrate is heated and soaked in one or more inert gases. In some examples, the inert gas includes molecular nitrogen ($N_2$) and may include one or more other inert gases such as argon (Ar), helium (He), or a combination thereof.

In some examples, a temperature of the substrate is maintained in a range between 350° C. to 550° C. during the soaking/heating. In some examples, a pressure of the processing chamber is maintained in a range from 0.8 to 9 Torr during the soaking/heating.

In some examples, the substrate is treated with a gas mixture including $N_2$ and Ar. In some examples, the $N_2$ gas is supplied in a range from 100 standard cubic centimeters per minute (sccm) to 20000 sccm and the Ar gas is supplied in a range from 100 sccm to 35000 sccm. In some examples, the $N_2$ gas is supplied at 5000 sccm and the Ar gas is supplied at 10000 sccm. As can be appreciated, the flow rates depend upon the volume of the processing chamber.

The initial soaking/heating causes nitridation of the exposed surface of the $SiO_2$ or SiN layer and creates the SiON interface. For substrates including exposed SiN, a native $SiO_2$ layer is typically formed when SiN is exposed to air. The soaking/heating step nitridates the native $SiO_2$ layer.

After nitridating the $SiO_2$ or SiN layer, an amorphous carbon layer is deposited. In some examples, the amorphous carbon layer is deposited by supplying a hydrocarbon precursor gas and a carrier gas and striking plasma in a PECVD chamber. In some examples, the precursor gases are supplied during a predetermined period in a range from 0.5 s to 15 s.

In some examples, the hydrocarbon precursor gas includes $C_xH_y$, where x and y are integers greater than or equal to one. In some examples, RF power of the plasma is in a range from 400 W to 9 kW at a frequency of 13.56 MHz and 400 W to 5 KW for 430 kHz. In some examples, the chamber pressure is maintained in a predetermined pressure range from 0.8 to 9 Torr. In some examples, the substrate temperature is maintained in a temperature range from 150° C. to 550° C. In some examples, gas flow rates are 50 sccm to 1000 sccm of $C_3H_6$ and $CH_4$.

In some examples, the carrier gas includes He, Ar, $N_2$, molecular hydrogen ($H_2$) and/or combinations thereof. The thickness and elemental composition of the amorphous carbon layer can be designed based on the integration process flow. In some examples, the amorphous carbon layer has a thickness in a range from 2 nm to 10 nm.

The amorphous carbon layer can also be designed to reduce the H content of the film. With more H in the amorphous carbon layer, more metal will diffuse into the amorphous carbon layer during subsequent steps. Therefore, the level of H in the amorphous carbon layer can be used to adjust metal doping in the amorphous carbon film. For example, if the amorphous carbon film has ~32% H % at, then ~10-20% W metal can be doped. However, if the amorphous carbon film is very dense (such as <10% H % at), then only ~5% W metal can be doped.

After depositing the amorphous carbon layer and extinguishing the plasma, process gases are evacuated from the processing chamber. An inert gas is supplied to the processing chamber. In some examples, the inert gas includes He since Ar and $N_2$ may modify the homogenous interface. A gas mixture including metal-containing precursor gas with a halide-based reducing agent is supplied to the processing chamber for a predetermined period without striking plasma in the processing chamber. This process replicates atomic layer deposition (ALD) and creates a metal monolayer. The underlying amorphous carbon layer includes H that is reduced by the flow of a halide-based metal precursor gas.

In this example, the homogenous interface includes metal-doped carbon, which is the same element as the bulk metal-doped carbon hardmask layer. The homogenous interface allows modulation of a vertical profile as needed using patterning and provides excellent adhesion to the substrate.

Figure 2:
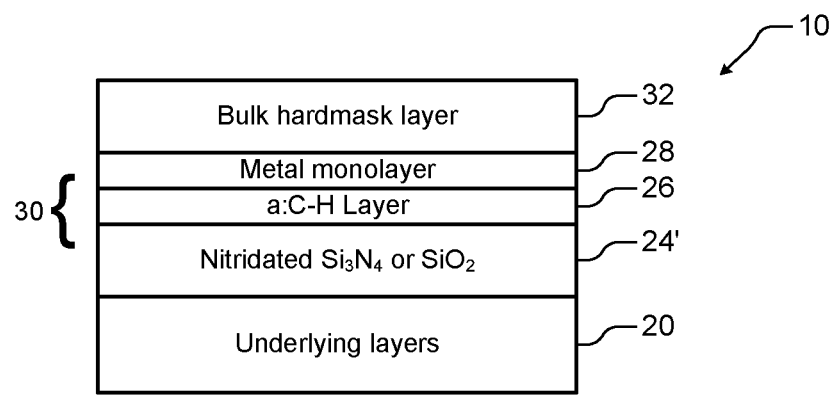
FIG. 2 is a side cross sectional view of an example of the substrate after nitridation of the silicon dioxide or silicon nitride layer, deposition of an amorphous carbon layer and a metal monolayer, and deposition of a bulk hardmask film according to the present disclosure.

Referring now to FIGS. 1-2, processing of a substrate according to the present disclosure is shown. In FIG. 1, a substrate 10 is shown prior to deposition of the bulk metal-doped carbon hardmask layer. The substrate 10 includes one or more underlying layers 20 and a $SiO_2$ or SiN layer 24 arranged on the one or more underlying layers 20. In FIG. 2, the substrate 10 is shown after nitridation of the $SiO_2$ or SiN layer (indicated by reference number 24'). An amorphous carbon layer 26 and a metal monolayer 28 are deposited on the nitridated $SiO_2$ or SiN nitride layer 24' as will be described further below. The nitridated $SiO_2$ or SiN nitride layer 24', the amorphous carbon layer 26 and the metal monolayer 28 form the homogenous interface 30. Subsequently, a bulk hardmask layer 32 is deposited on the homogenous interface 26.

Figure 3A:
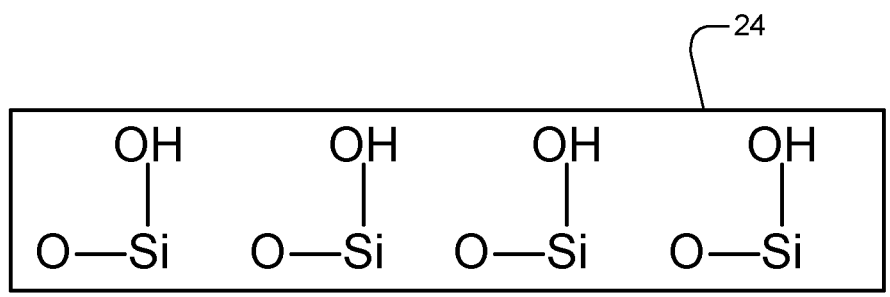
FIGS. 3A-6 illustrate an example of nitridation of the silicon dioxide or silicon nitride layer and deposition of the amorphous carbon layer and the metal monolayer.
Figure 3B:
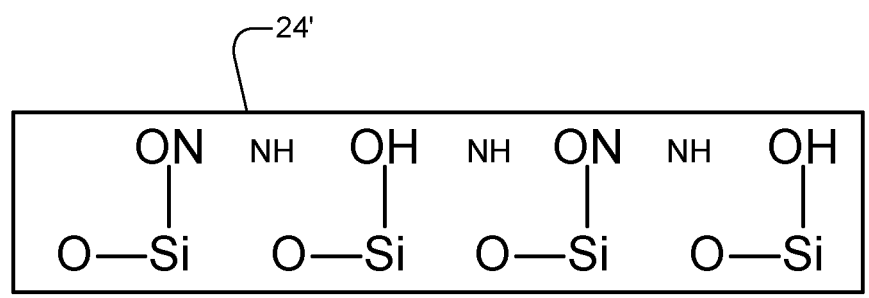
Figure 4:
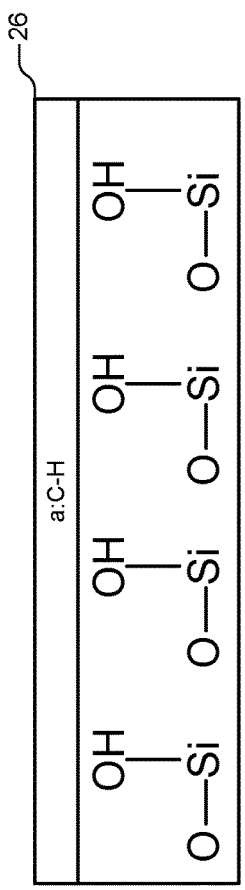
Figure 5:
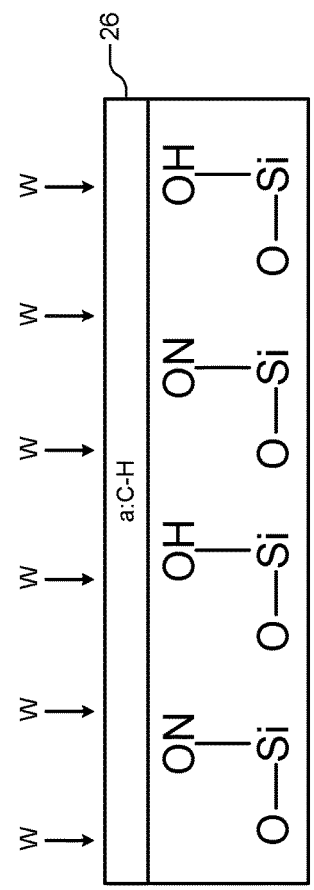
Figure 6:
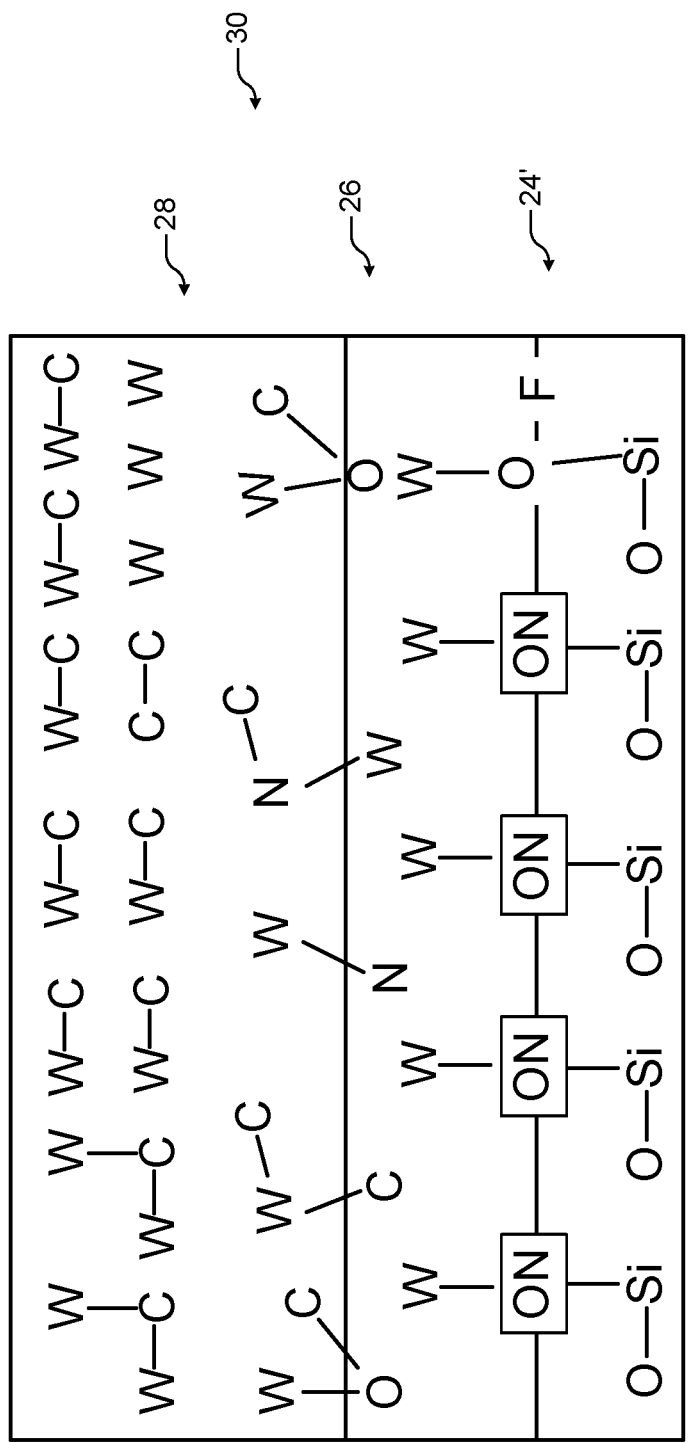

Referring now to FIGS. 3A-6, an example of processing of the $SiO_2$ layer is shown prior to deposition of the bulk hardmask layer. In FIGS. 3A-3B, Si—H content in the $SiO_2$ layer 24 is nitridated to create a silicon oxynitride (SiON) interface as shown in the nitridated $SiO_2$ layer 24' in FIG. 3B. In FIG. 4, an amorphous carbon film 26 is deposited on the nitridated $SiO_2$ layer 24'. In FIG. 5, a tungsten (W) precursor gas with a halide-based reducing agent is supplied to the processing chamber without striking plasma. The metal monolayer 28 (W in this example) is deposited as shown in FIG. 6. Subsequently, the bulk metal-doped carbon hardmask layer is deposited on the metal monolayer.

Figure 7:
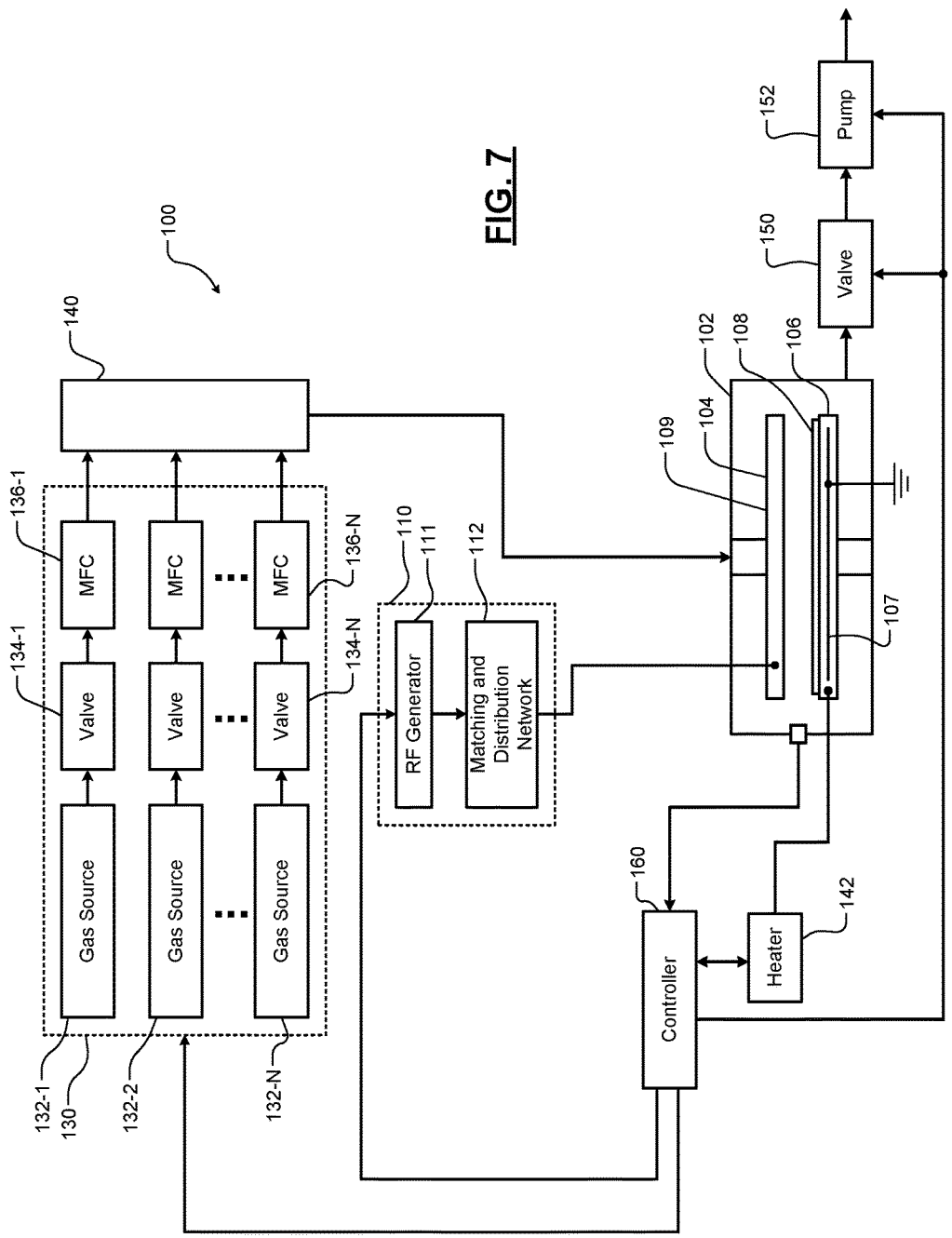
FIG. 7 is a functional block diagram illustrating an example of a substrate processing chamber for nitridating the silicon dioxide or silicon nitride layer, depositing the amorphous carbon layer and the metal monolayer, and depositing the bulk hardmask layer according to the present disclosure.

Referring now to FIG. 7, an example of a substrate processing system 100 is shown for nitridating the $SiO_2$ or SiN layer, depositing the amorphous carbon layer and the metal monolayer, and depositing the bulk hardmask layer according to the present disclosure. While the foregoing example relates to PECVD systems, other plasma-based substrate processing chambers may be used. While the present disclosure describes performing nitridation, deposition of the amorphous carbon layer and the metal monolayer, and deposition of the bulk hardmask layer in the same processing chamber, two or more separate processing chambers may be used.

The substrate processing system 100 includes a processing chamber 102 that encloses other components of the substrate processing system 100 and contains the RF plasma when used. The substrate processing system 100 includes an upper electrode 104 and a pedestal 106 including a lower electrode 107. A substrate 108 is arranged on the pedestal 106 between the upper electrode 104 and the lower electrode 107.

For example only, the upper electrode 104 may include a showerhead 109 that introduces and distributes process gases. Alternately, the upper electrode 104 may include a conducting plate and the process gases may be introduced in another manner. The lower electrode 107 may be arranged in a non-conductive pedestal. Alternately, the pedestal 106 may include an electrostatic chuck that includes a conductive plate that acts as the lower electrode 107.

An RF generating system 110 generates and outputs an RF voltage to one of the upper electrode and the lower electrode when plasma is used. The other one of the upper electrode and the lower electrode may be DC grounded, AC grounded or floating. For example only, the RF generating system 110 may include an RF voltage generator 111 that generates the RF voltage that is fed by a matching and distribution network 112 to the upper electrode 104 or the lower electrode 107.

An example of a gas delivery system 132 is shown in FIG. 7. A gas delivery system 132 includes one or more gas sources 132-1, 132-2, . . . , and 132-N (collectively gas sources 132), where N is an integer greater than zero. The gas sources supply one or more precursors and mixtures thereof. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A heater 142 may be connected to a heater coil (not shown) arranged in the pedestal 106 to heat the pedestal 106. The heater 142 may be used to control a temperature of the pedestal 106 and the substrate 108. A valve 150 and pump 152 may be used to evacuate reactants from the processing chamber 102. A controller 160 may be used to control various components of the substrate processing system 100. For example only, the controller 160 may be used to control flow of process, carrier and precursor gases, striking and extinguishing plasma, removal of reactants, monitoring of chamber parameters, etc.

Figure 8:
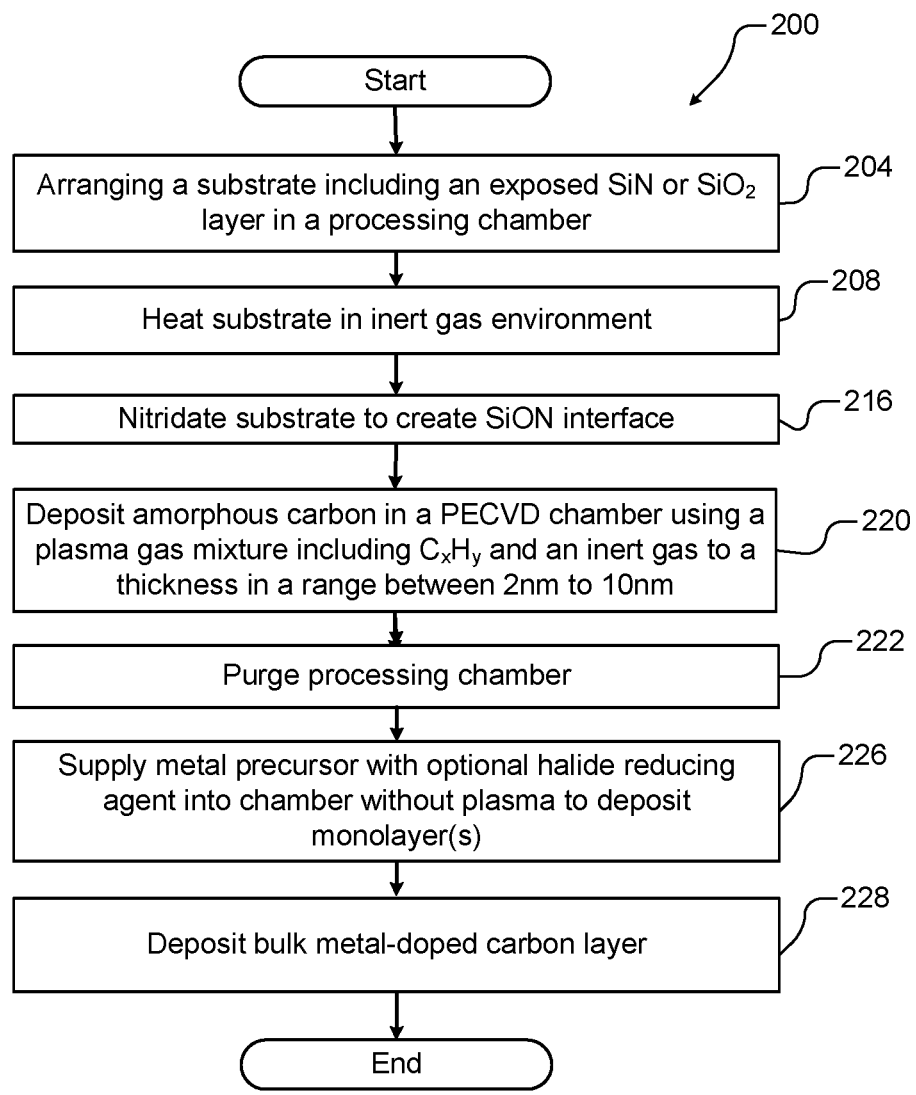
FIG. 8 is a flowchart illustrating an example of a method for nitridating the silicon dioxide or silicon nitride layer, depositing the amorphous carbon layer and the metal monolayer, and depositing the bulk hardmask layer according to the present disclosure.

Referring now to FIG. 8, a method 200 for nitridating the $SiO_2$ or SiN layer, depositing the amorphous carbon layer and the metal monolayer, and depositing the bulk metal-doped carbon hardmask layer according to the present disclosure is shown. At 204, a substrate including an exposed $SiO_2$ or SiN layer is arranged on a pedestal in the processing chamber. At 208, a substrate is heated to a predetermined temperature in an inert gas environment. The inert gas environment includes molecular nitrogen and may include one or more other inert gases. At 216, the substrate is nitridated to create the SiON interface.

At 220, amorphous carbon is deposited in the processing chamber using a plasma gas mixture including a hydrocarbon precursor gas and an inert gas. In some examples, the metal-based precursor described below is not supplied to the processing chamber during this deposition period. In some examples, the amorphous carbon layer is deposited to a thickness in a range between 2 nm and 10 nm. At 222, the processing chamber is purged. At 226, a metal precursor gas is supplied with a halide-based reducing agent to deposit one or more metal monolayers on the amorphous carbon layer. In some examples, the hydrocarbon precursor gas is not supplied during this deposition period. In some examples, the metal precursor gas includes tungsten hexafluoride ($WF_6$), tetrakis(dimethylamino)titanium (TDMAT), tungsten chloride (WCl), titanium chloride (TiCl), or any other metal containing precursor with a halide-based reducing agent. In some examples, the optional reducing agent gas includes a F or Cl gas species. At 228, a bulk hardmask layer such as a metal-doped carbon layer is deposited on the one or more metal monolayers.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing a hardmask layer on a substrate, comprising:
   nitridating a first layer of the substrate, wherein the first layer is selected from a group consisting of silicon dioxide and silicon nitride;
   depositing an amorphous carbon layer on the nitridated first layer via plasma-enhanced chemical vapor deposition (PECVD);
   depositing a monolayer on the amorphous carbon layer using gas mixture including a metal precursor gas with a reducing agent and without plasma; and
   depositing a bulk metal-doped carbon hardmask layer on the monolayer.

2. The method of claim 1, wherein a thickness of the amorphous carbon layer is in a range from 2 nm to 10 nm.

3. The method of claim 1, wherein the reducing agent comprises a halide-based reducing agent.

4. The method of claim 1, wherein the first layer includes silicon dioxide and the nitridating of the first layer creates a silicon oxynitride interface.

5. The method of claim 1, wherein the first layer includes silicon nitride layer, wherein the silicon nitride layer includes a native silicon dioxide layer, and wherein the nitridating of the first layer creates a silicon oxynitride interface.

6. The method of claim 1, wherein depositing the amorphous carbon layer includes supplying a gas mixture including a hydrocarbon precursor gas and an inert gas.

7. The method of claim 1, wherein the metal precursor gas includes a metal selected from a group consisting of tungsten (W), titanium (Ti), molybdenum (Mo), and aluminum (Al).

8. The method of claim 7, wherein the bulk metal-doped carbon hardmask layer includes the metal.

9. The method of claim 1, wherein the method is performed in a plasma-enhanced chemical vapor deposition (PECVD) chamber.

10. The method of claim 1, wherein nitridating comprises:
heating the substrate to a predetermined temperature in a temperature range from 350° C. to 550° C.; and
supplying an inert gas mixture include molecular nitrogen.

11. A method for depositing a hardmask layer on a substrate, comprising:
nitridating a first layer of the substrate,
wherein the first layer is selected from a group consisting of silicon dioxide and silicon nitride, and
wherein the nitridating includes heating the substrate to a predetermined temperature in a temperature range from 350° C. to 550° C., and supplying an inert gas mixture include molecular nitrogen;
depositing an amorphous carbon layer on the nitridated first layer via plasma-enhanced chemical vapor deposition (PECVD);
depositing a monolayer on the amorphous carbon layer having a thickness in a range from 2 nm to 10 nm using gas mixture including a metal precursor gas with a halide-based reducing agent and without plasma; and
depositing a bulk metal-doped carbon hardmask layer on the monolayer.

12. The method of claim 11, wherein the first layer includes silicon dioxide and the nitridating of the first layer creates a silicon oxynitride interface.

13. The method of claim 11, wherein the first layer includes silicon nitride layer, wherein the silicon nitride layer includes a native silicon dioxide layer, and wherein the nitridating of the first layer creates a silicon oxynitride interface.

14. The method of claim 11, wherein depositing the amorphous carbon layer includes supplying a gas mixture including a hydrocarbon precursor gas and an inert gas.

15. The method of claim 11, wherein the metal precursor gas includes a metal selected from a group consisting of tungsten (W), titanium (Ti), molybdenum (Mo), and aluminum (Al).

16. The method of claim 15, wherein the bulk metal-doped carbon hardmask layer includes the metal.

17. The method of claim 11, wherein the method is performed in a PECVD chamber.

* * * * *